United States Patent
Jakupi

(10) Patent No.: US 12,394,970 B2
(45) Date of Patent: Aug. 19, 2025

(54) DETECTING POWER LINE CARRIER PRESENCE IN A BRANCH CIRCUIT AND IMPROVING AF DETECTION AND NUISANCE TRIPPING IN CAFI/DF BREAKER

(71) Applicant: Schneider Electric USA, Inc., Andover, MA (US)

(72) Inventor: Andi Jakupi, Marion, IA (US)

(73) Assignee: Schneider Electric USA, Inc., Boston, MA (US)

( * ) Notice: Subject to any disclaimer, the term of this patent is extended or adjusted under 35 U.S.C. 154(b) by 193 days.

(21) Appl. No.: 18/233,035

(22) Filed: Aug. 11, 2023

(65) Prior Publication Data

US 2024/0222951 A1  Jul. 4, 2024

Related U.S. Application Data

(60) Provisional application No. 63/435,823, filed on Dec. 29, 2022.

(51) Int. Cl.
    *G01R 1/067*  (2006.01)
    *G01R 31/08*  (2020.01)
    *H02H 1/00*  (2006.01)

(52) U.S. Cl.
    CPC ......... *H02H 1/0015* (2013.01); *G01R 31/085* (2013.01); *H02H 1/0092* (2013.01)

(58) Field of Classification Search
    CPC .. G01R 31/085; G01R 31/52; G01R 31/1227; G01R 31/1272; G01R 31/1263;
    (Continued)

(56) References Cited

U.S. PATENT DOCUMENTS 7,349,188 B2 * 3/2008 Zuercher ............... H02H 1/04
                                                 361/42
11,675,012 B2 * 6/2023 Lesperance ........ G01R 31/1263
                                                 324/765.01
(Continued)

FOREIGN PATENT DOCUMENTS

WO    2021168265 A1    8/2021

OTHER PUBLICATIONS

International Search Report and Written Opinion dated Apr. 23, 2024 for corresponding International Application No. PCT/US2023/085891, 20 pages.

*Primary Examiner* — Thang X Le
(74) *Attorney, Agent, or Firm* — Troutman Pepper Locke LLP

(57) ABSTRACT

A method and system are provided to detect the presence of an arc fault signal on a circuit of a power distribution system. The method and system can involve: sampling a signal measuring electrical activity on the circuit, the sampled signal corresponding to a signal strength of the electrical activity on the circuit, the sampled signal comprising a plurality of sample segments; for each sample segment, computing segment properties including a signal-to-noise ratio and a root-mean-square; generating a pattern representing a presence of any signal transition over a signal sample period for the sampled signal according to the computed segment properties for each sample segment of the sampled signal; and determining a presence of an arc fault signal based on the generated pattern and predetermined pattern(s) of PLC activity on the circuit.

21 Claims, 15 Drawing Sheets

(58) Field of Classification Search
CPC .... G01R 31/14; G01R 31/343; H02H 1/0015; H02H 1/0092
See application file for complete search history.

(56) References Cited

U.S. PATENT DOCUMENTS

| | | |
|---|---|---|
| 2006/0259281 A1* | 11/2006 | Kuppuswamy .... G01R 31/1209 702/56 |
| 2006/0274460 A1 | 12/2006 | Zuercher et al. |
| 2011/0249370 A1 | 10/2011 | Nayak et al. |
| 2014/0324367 A1* | 10/2014 | Garvey, III ............ G01D 18/00 702/56 |
| 2017/0025996 A1* | 1/2017 | Cheung ................ H02H 1/0015 |
| 2019/0339319 A1 | 11/2019 | Jakupi |
| 2021/0057900 A1* | 2/2021 | Kay ..................... H02H 1/0015 |

* cited by examiner

DETECTING POWER LINE CARRIER PRESENCE IN A BRANCH CIRCUIT AND IMPROVING AF DETECTION AND NUISANCE TRIPPING IN CAFI/DF BREAKER

The present application claims priority to U.S. Provisional Patent Application Ser. No. 63/435,823, filed Dec. 29, 2022. The disclosure of the above-identified prior U.S. Patent Application, in its entirety, is considered as being part of the present application, and thus, is incorporated herein by reference in its entirety.

FIELD

The present disclosure is generally directed to fault detection in an electrical power distribution system and, more particularly, to methods and systems for performing fault detection on a power distribution system which may implement power line carrier communication.

BACKGROUND

The use of Power Line Carrier (PLC) modules is becoming popular in many applications in homes. These PLC modules are an efficient way to provide fast Internet speeds without the need for wired network or extend WiFi coverage with multiple Access Points. They utilize AC network at home to provide high speed internet communication between connected devices. Because these devices operate at a high frequency range from 1.8 MHz to 27 MHz, they can cause nuisance tripping on some AFCI devices or blind AF detection, rendering them less efficient.

SUMMARY

In accordance with an embodiment, a method and system are provided which involve: sampling a signal measuring electrical activity on a circuit of a power distribution system, the sampled signal corresponding to a signal strength of the electrical activity on the circuit, the sampled signal comprising a plurality of sample segments; for each sample segment, computing segment properties including a signal-to-noise ratio (SNR) and a root-mean-square (RMS); generating a pattern representing a presence of any signal transition over a signal sample period for the sampled signal according to the computed segment properties for each sample segment of the sampled signal; and determining a presence of an arc fault signal based on the generated pattern and predetermined pattern(s) of PLC activity on the circuit.

In various embodiments, the method and system further comprise determining a presence of power line carrier (PLC) activity across the circuit. The segment properties are computed in response to at least the presence of power line carrier activity on the circuit.

In various embodiments, the generating operation can comprise: assigning one of a positive, negative or zero value based on the computed SNR and/or RMS for each of the sample segments in comparison to a respective segment property threshold; creating a first binary word to reflect any positive vector representations across the plurality of sample segments; creating a second binary word to reflect any negative vector representation across the plurality of sample segments; and applying a XNOR (Exclusive Not Or) function to the first and second binary words to create a third binary word for the sampled signal.

In various embodiments, the pattern can comprise a binary word. The generated pattern can be a binary word having side regions reflecting potential side transitions and a center region reflecting potential center transitions. The presence of an arc fault signal can be determined when the side transitions of the generated pattern have a non-zero value and diminish to a zero value in the center transitions of the generated pattern. The side transitions with the non-zero value can represent captured transitions around zero-cross around arc strike and quench regions, and the center transitions with the zero value can represent PLC communication.

In various embodiments, the determining can comprise analyzing a value of side transitions/regions and center transitions/region from the third binary word to detect a presence of an arc fault signal.

In various embodiments, the method and system can further involve: determining one or more patterns of PLC activity on the circuit, the patterns of PLC activity including at least a pattern of PLC beacon; and storing the one or more patterns as one or more of the predetermined patterns of PLC activity.

In various embodiments, the method and system can further involve: in response to a detection of an absence of PLC activity, performing fault detection by comparing a signal strength of high frequency signals within an electrical activity, including voltage or current, to a set of dynamic thresholds.

In various embodiments, the PLC activity can comprise a PLC beacon or PLC communication. The sampled signal can comprise an RSSI (Receiver Signal Strength Indicator) signal, which can be generated by logarithmic amplifier device based on electrical signals monitored on the branch circuit by at least one high frequency sensor. Each of the sample segments of the sampled signal can have the same length which comprise a half-cycle signal length.

It is to be understood that both the foregoing general description and the following detailed description are exemplary and explanatory only and are not restrictive of the invention, as disclosed or claimed. The claims should be entitled to their full breadth of scope, including equivalents.

DESCRIPTION OF THE FIGURES

The description of the various example embodiments is explained in conjunction with the appended drawings.

DISCUSSION OF EXAMPLE EMBODIMENTS

Figure 1:
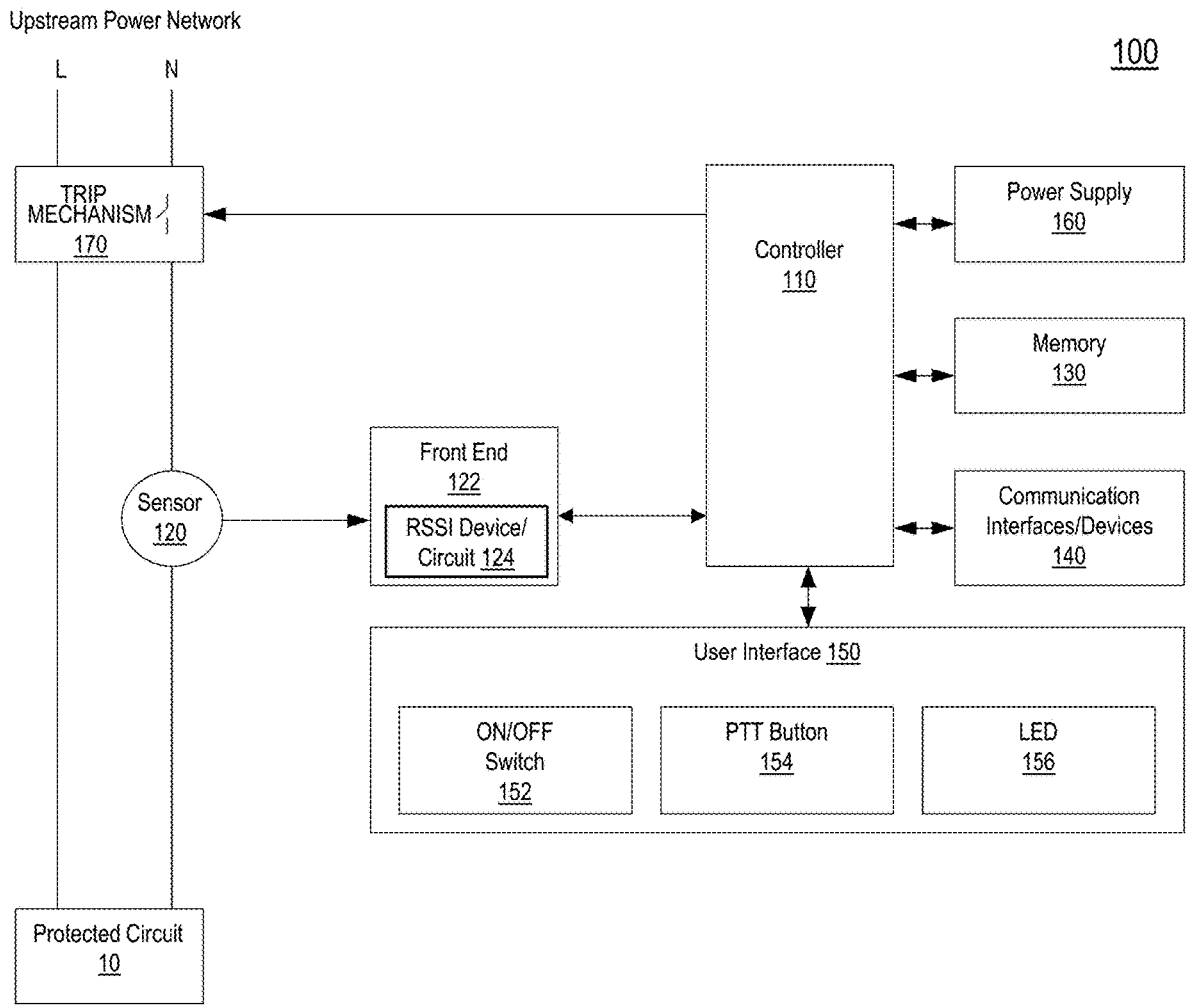
FIG. 1 illustrates an example of a block diagram of an arc detection system for detecting arc fault signals and/or power line carrier (PLC) communication on an electrical power distribution system, in accordance with an embodiment of the present disclosure.

A method and system are provided to detect power line carriers in a power distribution system and improve arc fault (AF) detection and load interoperability based on the high frequency envelope of the monitored signal. The method and system can be based in the envelope of a high frequency signal (e.g., demodulated and amplified in logarithmic scale signal). Such a baseband signal can consist of much lower frequency (e.g., <100 KHz) which can be sampled at lower rates.

The sampled signal strength (e.g., Received Signal Strength Indicator or RSSI signal) of the monitored signal(s) on the power distribution system (or portion thereof) can be segmented. Each segment samples can be analyzed based on the Signal-to-Noise Ratio (SNR) values. The method and system can detect the presence of the PLC signals over a certain amount of time and the PLC synchronization patterns. Once this detection is established then the method and system can distinguish between arc fault signals and communication streaming signals.

The method and system of the present disclosure can provide various benefit(s)/advantage(s). For example, because the method and system can operate with a significantly lower sampling rate, the hardware requirements are simpler, and the computation requirements are much lower. Therefore, the method and system can allow for a fast and low cost of computation, and can achieve arc fault detection without compromising load interoperability.

In various embodiments, the method and system can rely, for example, on certain Power Line Carrier (PLC) signal signatures (e.g., such as PLC Beacons and their occurrence over a certain amount of time) that can be detected in a time domain. After the signal strength samples (e.g., RSSI samples) are acquired for a signal period (e.g., half-cycle), these segment samples are grouped and for each segment there is a determination of the Root-Mean-Square or RMS (e.g., RSSI RMS), Min, Max, SNR values, etc. and classification of these parameters into a vector from two or more vectors (e.g., positive vector, negative vector, null/zero vector, etc.).

In various embodiments, once a PLC presence is determined, both positive and negative vectors are processed again to determine transitions within a signal period (e.g., a half-cycle). For example, using a XNOR function over these two binary words and extracting transition bits shows the location where these transitions occur. Side transitions and center transitions can correlate with arc-fault and power line carrier signal dynamics respectively. An arc fault can consist of transitions around the zero-cross around the arc strike and quench regions which are captured at side transitions. PLC streaming can consist of transitions in the center and side regions. If arcing occurs during PLC streaming, then center transitions will diminish to zero (0); therefore, an AF flag can be set.

In various embodiments, the method and system can perform determination of noise floor, maximum peak, and SNR for raw RSSI samples within a time period (e.g., a half-cycle). The method and system can break the RSSI samples into multiple (N) equal length segments, and determine: [a] Segment RMS[i], SNR[i] and dynamic threshold (TH[i]); [b] Classification of each segment with a positive or negative bit (1, −1, or 0), [c] Creation of two parameter vectors for positive and negative bits; [d] Conversion of these vectors to binary words; [e] Computation of exclusive NOR (XNOR) of two binary words (positive and negative); and [f] Creation of transition words based on XNOR result. The method and system can determine patterns created from positive and negative parameters over 4 to N half-cycles, determine Power Line Carrier beacons and PLC communication presence, determine Arc Fault presence; and classify Arc Fault Half-Cycle or PLC or High Frequency interference to improve Arc Fault algorithm decision. In the event an Arc Fault presence is determined, the method and system can interrupt power to the monitored and protected circuit, via a trip mechanism.

These and other example detection methods and systems and features associated therewith of the present disclosure are shown and described in the attached figures and the Appendices which are incorporated herewith in their entirety.

FIG. 1 illustrates an example of a block diagram of an arc fault detection system 100, in accordance with an embodiment. In this example, the arc fault detection system 100 can be implemented on a circuit breaker to monitor signals on a power line of a protected circuit 10. The signals can be high frequency (HF) signals. The circuit breaker can include a controller 110, a front end 122 with an RSSI device (or circuit) 124 to receive signals from a sensor 120 (e.g., current sensor or other sensor for measuring electrical signal on the power line) and to generate corresponding signal strength samples or the like, a memory 130, communication interfaces/devices 140 to communicate with remote devices over a communication medium, a user interface 150, a power supply 160 to power the components of the circuit breaker, and a trip mechanism 170 to interrupt power on the power line upstream of the protected circuit 10. The user interface 150 can include an ON/OFF switch 152 (e.g., a handle), a push-to-test (PTT) button 154 to test the circuit breaker, and one or more LEDs or other indicators 156 for indicating a status of the circuit breaker (e.g., ON, OFF, RESET, TRIPPED, etc.) or other circuit breaker information. The sensor 120 can be a current sensor such as a Rogowski coil or other sensor to measure signals on the power line, and can be a HF current sensor. The measured signals may be high frequency signals or signals in a frequency range, which are used for power line carrier (PLC) communication. The RSSI device 124 can be a logarithmic amplifier device.

In the circuit breaker, the front end 122/RSSI circuit 124, the controller 110 and memory 130 can operate together to provide an arc fault detection system, which can be configured to detect arc fault signals and/or power line carrier communication on the power line, such as described herein. The front end 122 can be configured to receive and monitor signals in desired frequency region(s) from the sensor 120, and provide measurements of signal strength of the monitored signals (e.g., RSSI signals). The front end 122 can be an analog front end which can include a radio frequency (RF) receiver (including a band-pass filter(s)), a signal strength indicator (e.g., RSSI circuit), A/D converter, signal conditioning circuitry and so forth.

The controller 110 can be configured to implement the various functions and features, including those related to arc fault detection and/or PLC detection, as described herein. The arc fault detection features can include, for example, detection of PLC on a power line of a power distribution system, computation of RMS and SNR and thresholds associated therewith (e.g., dynamic thresholds) and Maximum (Max) and Minimum (Min) for each sampled segment (e.g., sampled RSSI segment) or other parameters, assigning a representative value (e.g., vector, etc.) to each segment, generating a pattern or representation thereof for a group of segments (e.g., a binary word); detecting arc fault signals or other conditions based on the pattern or representation thereof, so forth. In various embodiments, various operations and functions associated with arc fault detection can be implemented on other processing circuits, such as ASIC or FPGA or other processor, or between other processing circuits/processor and the controller.

The controller 110 is also configured to initiate a circuit breaker trip operation, which can interrupt power on the power line via the trip mechanism under certain conditions, including when the presence of an arc fault signal or other condition is detected. The controller 110 is also configured to control other operations of the circuit breaker including communication via the communication interfaces/devices 140 (e.g., to receive or transmit commands or status information/reports), to perform operations based on actions input by a user through the user interface 150, to output a status of the circuit breaker such as via the LED 156 or other output device, and to perform other operations of the circuit breaker related to arc fault detection and power interruption.

The memory 130 can store computer executable code or programs or software, which when executed by the controller (or its processor(s)), controls the operations of the circuit breaker including the arc fault detection and/or PLC detection operations and other circuit breaker operations such as circuit interruption. The memory 130 can also store other data used by the circuit breaker or components thereof to perform the operations described herein. The other data can include but is not limited to RMS value(s), SNR value(s), Maximum value(s), Minimum value(s), thresholds, predetermined patterns or signatures including those for power line carrier(s) (e.g., PLC beacon or communication), other circuit breaker data, and other data discussed herein.

Figure 2:
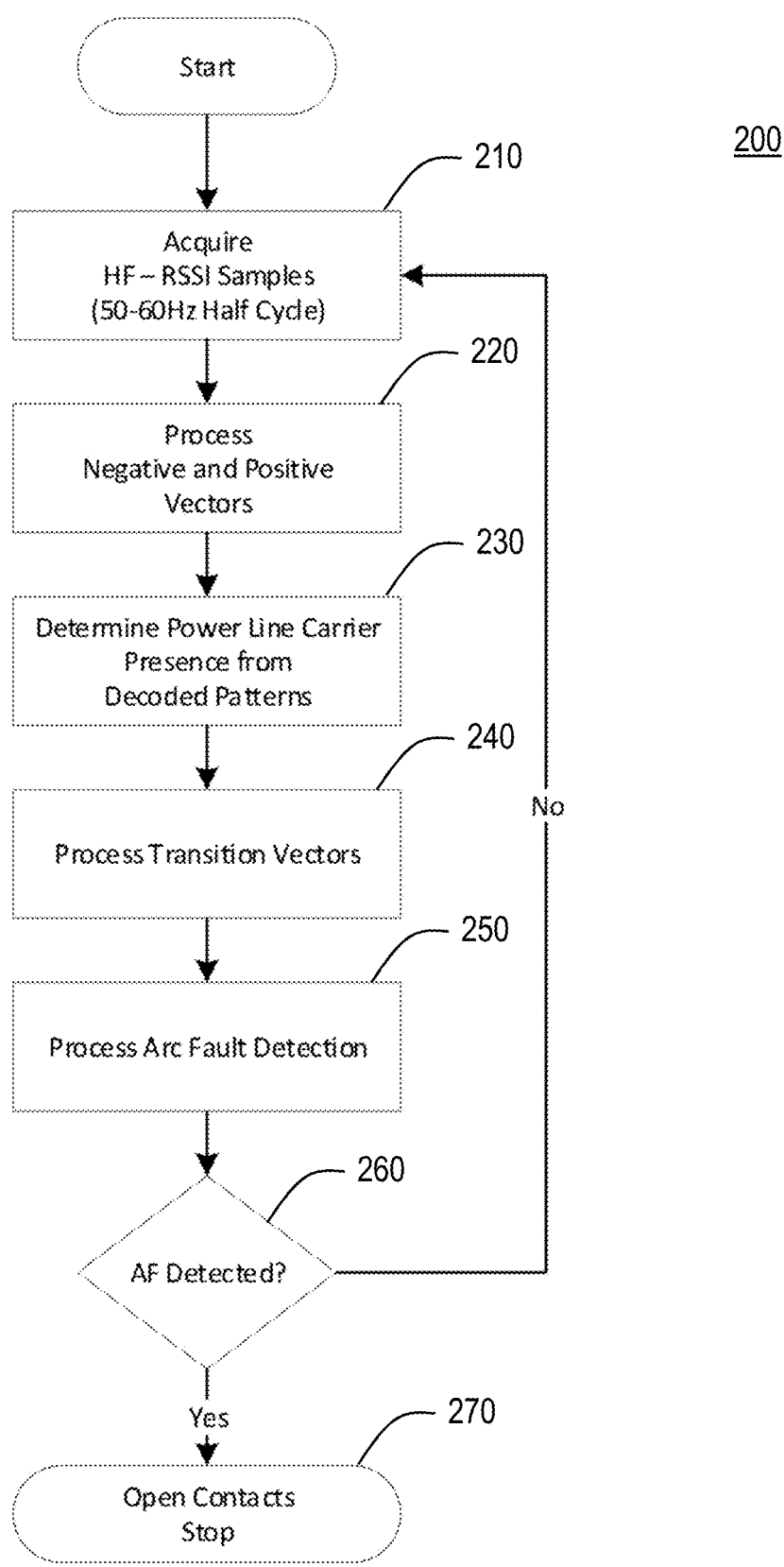
FIG. 2 illustrates a high-level flow chart of an example arc fault detection process by which arc fault signal(s) is detected on a power distribution system or portion thereof, in accordance with an embodiment of the present disclosure.

FIG. 2 illustrates a high-level flow chart of an example of an arc fault detection process 200 by which arc fault signal(s) can be detected on a power distribution system or portion thereof, in accordance with an embodiment of the present disclosure. In various embodiments, the process 200 can operate over RSSI samples (e.g., raw RSSI samples) acquired for each half-cycle synchronized from AC line voltage and can classify the half-cycles whether there is Arc Fault signal present or PLC or High Frequency interference noise. The flow chart of FIG. 2 shows examples of the main processing blocks and the creation of parameters for an improved Arc Fault detection process.

By way of example, the process 200 and other processes below will be described below with reference to one or more processors (also referred to herein as processor or processor(s)), which are configured to implement or control the various operations described herein.

The process 200 begins at block 210 in which the processor acquires signal samples reflecting electrical activity monitored on a circuit of a power distribution system, such as a branch circuit. The signal samples can for example be acquired periodically. In various embodiments, the signal samples can be raw RSSI samples acquired for each half-cycle synchronized from line voltage (e.g., AC line voltage) on the monitored circuit. These samples can be grouped into N sample segments over a desired period to be analyzed.

At block 220, the processor processes negative and positive vectors for the acquired signal samples.

For example, after sample segments (e.g., RSSI samples) are acquired, the processor can compute RMS, SNR, noise floor and maximum peak values. These samples can be grouped into N segments. Segment properties such as RMS, SNR, Minimum and Maximum values, and dynamic threshold(s) can be determined for each segment for use in determining (e.g., determining, creating, computing, etc.) vectors, namely positive and negative vectors.

At block 230, the processor determines a power line carrier presence from decoded patterns.

At block 240, the processor processes transition vectors. For example, the processor can process the positive and negative vectors for the signal samples to produce a word, pattern or other representative data, from which to analyze the presence of any transitions.

At block 250, the processor performs arc fault detection. For example, the processor can detect the presence of an arc fault signal based on the presence of any transitions in the sampled segments.

At block 260, the processor determines whether an arc fault (AF) or AF signal is detected. If not, the process 200 returns to block 210 to acquire more signal samples for analysis. Otherwise, the processor can interrupt power to the protected circuit at block 270. For example, the processor can control a trip mechanism to open contacts to interrupt power flow to the protected circuit.

Various examples of the operations or functions performed by the process 200 are described in greater detail further below with reference to FIGS. 3, 4 and 5 and the other figures.

In various embodiments, when PLC presence is not detected, the processor can be configured to implement arc fault detection using conventional or other detection methodologies. For example, the property of the sampled signals such as current or voltage can be compared to a threshold to detect an occurrence of an arc fault.

Figure 3:
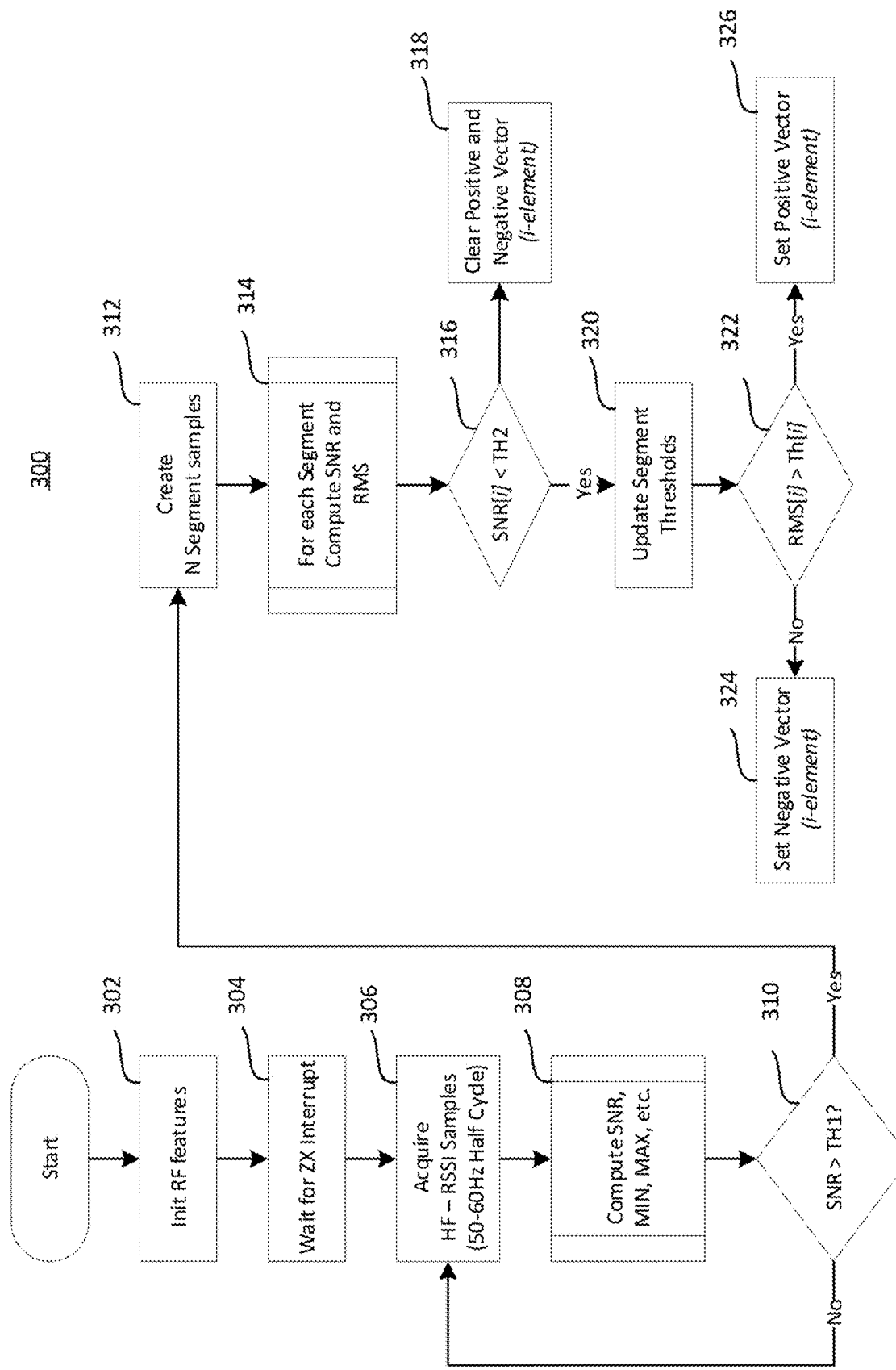
FIG. 3 illustrates a flow chart of an example process of the arc fault detection process by which sampled segment(s) of a sampled signal is assigned representative value to generate positive and negative vectors for arc fault detection analysis, in accordance with an embodiment of the present disclosure.

FIG. 3 illustrates an example process 300 of the arc fault detection process by which sampled segment(s) of a sampled signal is assigned representative value from which to generate positive and negative vectors for arc fault detection analysis, in accordance with an embodiment of the present disclosure. For example, after sample segments (e.g., RSSI samples) are acquired, the processor can compute RMS, SNR, noise floor and maximum peak values, and any other segment/signal properties. These samples can be grouped into N segments, and the segment properties such as RMS, SNR, dynamic thresholds, etc. can be computed for each segment for use in creating two vectors, namely positive and negative vectors. In various embodiments, a representative value of 1 (positive), −1 (negative) or 0 (zero) can be assigned to each segment based the RMS and SNR. A positive vector can be generated according to the positive values, and the negative vector can be generated according to the negative values.

The process 300 begins at block 302 in which the processor initializes radio frequency (RF) features.

At block 304, the processor waits for ZX interrupt.

At block 306, the processor acquires signal samples. For example, the signal samples can be RSSI samples of the monitored electrical activity on a circuit.

At block 308, the processor computes various properties of the signal samples or segments of the sampled signal. The properties can, for example, include signal-to-noise ratio (SNR), root-mean-square (RMS), minimum (MIN), maximum (MAX), and other properties to facilitate the detection of desired signals, including but not limited to PLC signals, arc fault signals and so forth.

At block 310, the processor determines whether the SNR is greater than a first SNR threshold (e.g., Threshold 1 or TH1). The SNR threshold can be a minimum or cut-off SNR which is required for processing of sampled signals to perform various detection algorithms (or processes/methods) described herein. If not, the process 300 returns to block 306 to acquire new signal samples. Otherwise, at block 312, the processor creates N segment samples.

At block 314, the processor computes the SNR and RMS for each segment.

At block 316, for each segment, the processor determines whether the SNR of the segment is less than a second SNR threshold (e.g., SNR segment <TH2). If the SNR for a segment is not less than the second SNR threshold, the processor clears the positive and negative vector at block 318. Otherwise, if the SNR is less than the second SNR threshold, the process 300 proceeds to block 320.

At block 320, the processor updates the segment threshold for each segment. For example, the segment threshold for a segment can be computed based on minimum value of the segment and the SNR of the segment. Accordingly, the segment threshold for each segment can be dynamic.

At block 322, for each segment, the processor determines whether the RMS of the segment is greater than an RMS threshold (e.g., RMS segment >TH). If the RMS for a segment is not greater than the RMS threshold, the processor sets a negative vector (for the i-element) at block 324. Otherwise, if the RMS for a segment is greater than the RMS threshold, the processor sets a positive vector (for the i-element) at block 326.

Accordingly, the process 300 can be employed to generate positive and negative vectors (or representations thereof) for N segments of a sampled signal.

Figure 4:
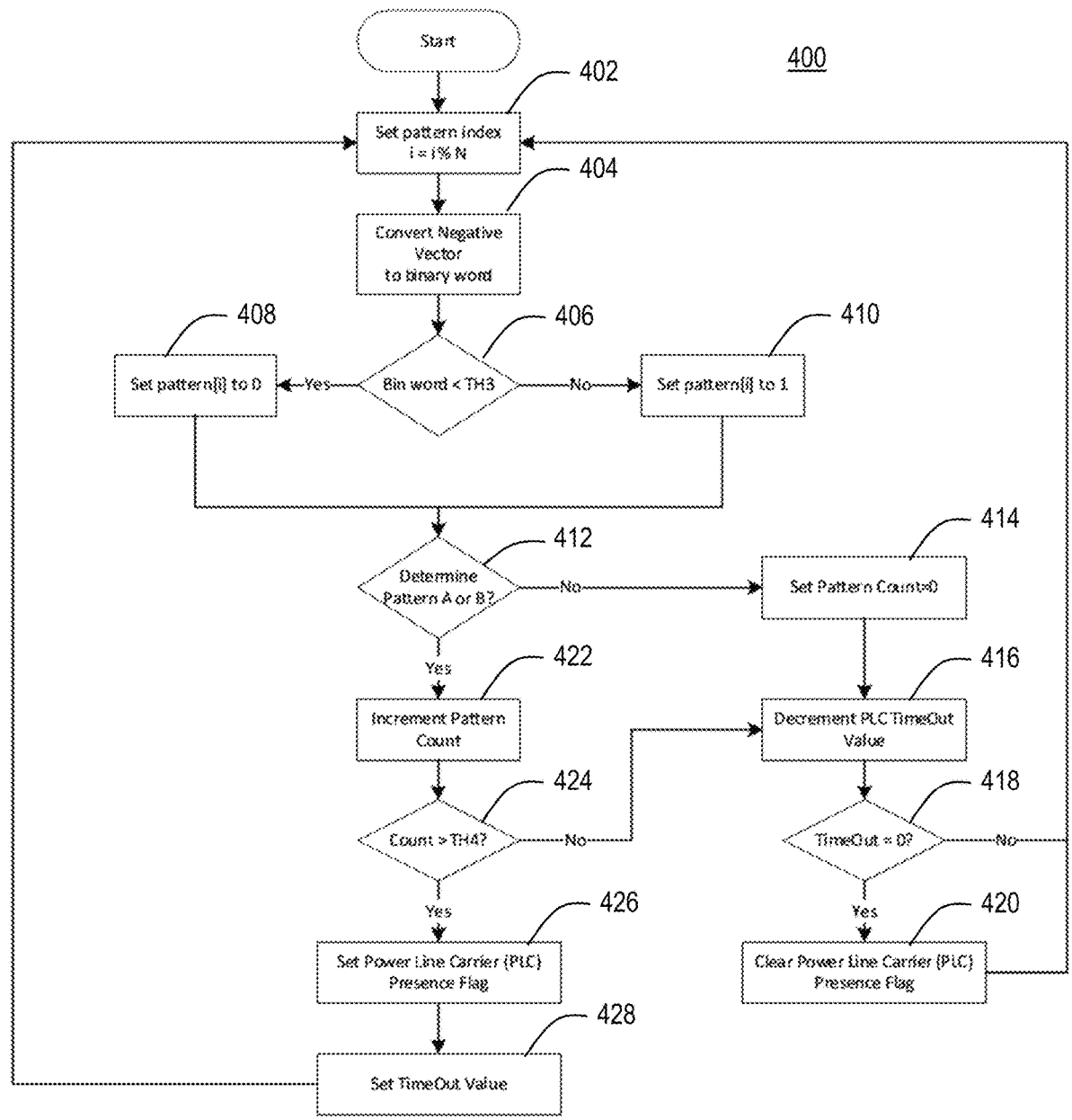
FIG. 4 illustrates a flow chart of an example process of the arc fault detection process by which to detect PLC presence and set a PLC presence flag, in accordance with an embodiment of the present disclosure.

FIG. 4 illustrates an example process 400 of the arc fault detection process by which to detect PLC presence and set a PLC presence flag, in accordance with an embodiment of the present disclosure.

The process 400 begins at block 402 in which the processor sets a pattern index (e.g., i=i % N, where N represents a number of segments from in a time period and where i=1 . . . N and represents an ith sample segment).

At block 404, the processor converts a negative vector to a binary word.

At block 406, the processor determines whether the binary word is less than a threshold (e.g., TH3). If the binary word is less than the threshold, the processor sets the pattern[i] to 0 at block 408. Otherwise, if the binary word is greater than or equal to the threshold, the processor sets the pattern [i] to 1 at block 410.

In either case, the process 400 thereafter proceeds to block 412 in which the processor then determines whether a pattern A or B can be determined. If not, the processor sets the pattern count to zero (e.g., Pattern Count=0) at block 414. The processor then decrements or decreases a time out value of the PLC (e.g., PLC TimeOut Value) at block 416. At block 418, the processor determines whether the time out value is equal to zero (e.g., TimeOut=0). If the time out is not equal to zero, the process 400 returns back to block 404. Otherwise, if the time out value is equal to zero, the processor clears the Power Line Carrier (PLC) presence flag, and the process 400 returns back to block 404.

Turning back to block 412, if a pattern A or B is determined, the processor increments the pattern count (e.g., Pattern Count=Pattern Count+1) at block 422. At block 424, the processor determines whether the pattern count is greater than a threshold, e.g., TH4. If the pattern count is not greater than the threshold, the process 400 proceeds to block 416. Otherwise, if the pattern count is greater than the threshold, the processor sets the PLC presence flag at block 426. At block 428, the processor sets the time out value (e.g., TimeOut value). Thereafter, the process 400 returns to block 402.

Figure 5:
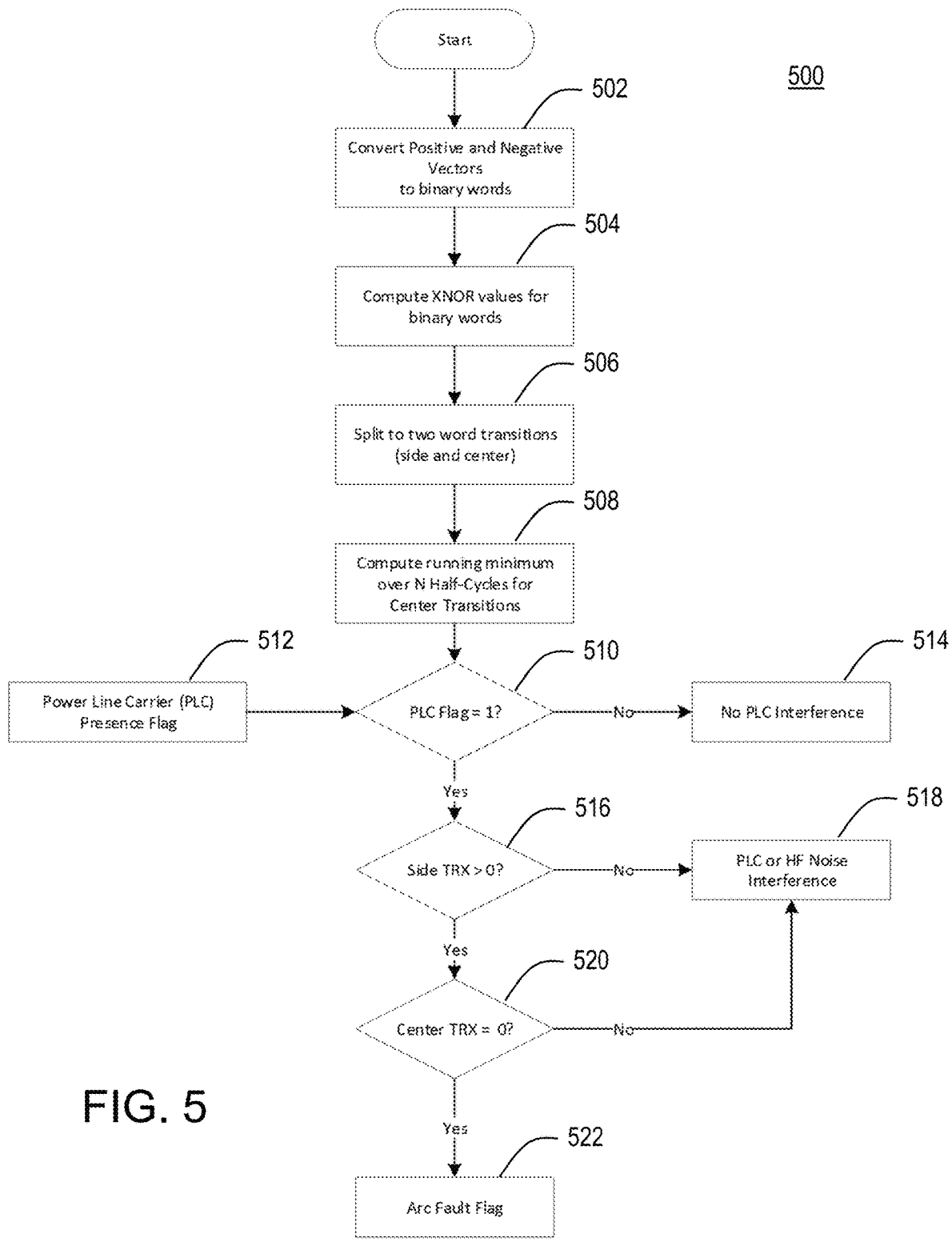
FIG. 5 illustrates a flow chart of an example process of the arc fault detection process by which an arc fault signal(s) is detected on a power distribution system or portion thereof, in accordance with an embodiment of the present disclosure.

FIG. 5 illustrates an example process 500 of the arc fault detection process by which an arc fault signal(s) is detected on a power distribution system or portion thereof, in accordance with an embodiment of the present disclosure. The process 500 provides for the classification of no PLC presence, presence of PLC or HF noise interference or arc fault flag, which is used by the arc fault detection algorithm (also referred to as process or method) to determine whether to interrupt power to the protected circuit.

The process 500 begins at block 502 in which the processor converts the positive and negative vectors to binary words. For example, the binary word can include a first binary word based on the positive vectors (e.g., for each segment, the binary value=1 if positive or otherwise 0), and a second binary word based on the negative vectors (e.g., for each segment, the binary value=1 if negative or otherwise 0).

At block 504, the processor computes XNOR values for the first and second binary words to generate a third binary word (or XNOR binary word).

At block 506, the processor splits the XNOR binary word into two-word transitions, such as side(s) and center.

At block 508, the processor computes the running minimum over N Half-Cycles for center transitions.

At block 510, the processor checks for the presence of PLC. For example, the processor accesses information for the value of the PLC presence flag at block 512, and checks if the PLC Flag=1 (present) or =0 (not present). If the PLC Flag does not reflect a presence of PLC, the process 500 proceeds to block 514 and determines no PLC interference.

Otherwise, if the PLC Flag does reflect a presence of PLC at block 510, the processor determines whether the value of the side transition (TRX) is greater than zero (e.g., Side TRX>0) at block 516. If the value of the side transition is not greater than zero at block 516, the processor determines PLC or HF noise interference at block 518. If the value of the side transition is greater than zero at block 516, the processor determines whether the center transition is equal to zero (e.g., Center TRX=0) at block 520. If the value of the center transition is not equal to zero at block 520, the processor determines PLC or HF noise interference at block 518. Otherwise, if the value of the center transition is equal to zero at block 520, the processor determines the presence of an arc fault (or signal thereof) and sets the arc fault flag (e.g., AF Flag=1) at block 522.

Figure 6:
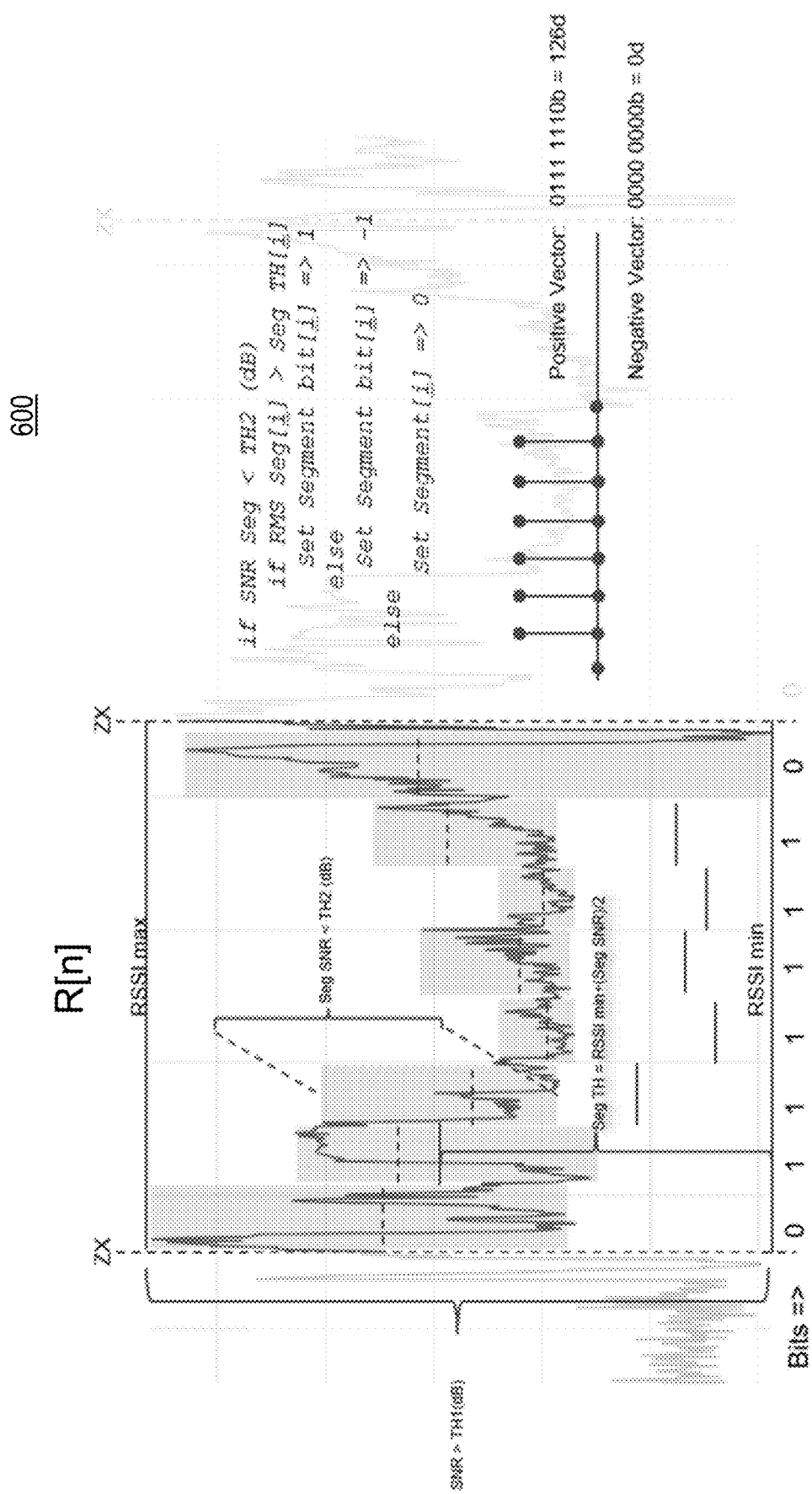
FIG. 6 illustrates a vector assignment example for sampled segments of a signal over a signal period, in accordance with an embodiment.

FIG. 6 illustrates a vector assignment example 600 for sampled segments of a signal over a half-cycle period, in accordance with an embodiment. In FIG. 6, two vectors such as a positive vector and a negative vector can be created for each signal period, such for example as a half-cycle, which are then processed again to create patterns that are used to determine whether Power Line Carrier or arc fault signal(s) are present. In this example, there is shown an arc fault signal and the corresponding positive and negative bytes. The sampled segments are processed individually to determine dynamic threshold Seg TH[i], where i=1 ... N and N is a number of sampled segments. Each sampled segment is marked with a positive value (1), negative value (−1) or zero value (0) based on the conditions satisfied by the thresholds.

More specifically, as shown in the example of FIG. 6, for each sampled segment [i], there can be determined (e.g., determined, computed, calculated, derived, assigned, etc.) SNR, RMS, Min and Max, where i=1 ... N and N is a number of segments for a defined signal period. A segment threshold (Seg TH) can be a dynamic threshold, which can be determined for each segment [i]. For example, the segment threshold can be represented by the equation as follows:

$$Seg\ TH_i = RSSI\ MIN_i + (Seg\ SNR_i)/2,$$

where:
Seg TH is a segment threshold,
RSSI MIN is the minimum value of the segment,
Seg SNR is the SNR for the segment, and
i is the segment number from 1 ... N, and
N is a number of segments in a defined signal period.
In various embodiments, the defined signal period can be a half-cycle.

A value (or representation thereof) can be determined (e.g., determined, computed, calculated, derived, assigned, etc.) for each segment [i]. In this example, a value can be determined for each segment as follows:
If the SNR of a segment [i] is less than a SNR threshold (e.g., a second SNR threshold TH2 in dB) and if RMS of the segment [i] is greater than the segment threshold (e.g., Seg TH[i]), the vector value of the segment bit [i] is set to positive or 1.
If the SNR of a segment [i] is less than the SNR threshold and if RMS of the segment [i] is NOT greater than the segment threshold, the vector value of the segment bit [i] is set to negative or −1.
If the SNR of a segment [i] is NOT less than the SNR threshold, the vector value of the segment bit [i] is set to zero or 0.

For the above approach, it is desirable for the overall signal SNR to be above a certain threshold TH1 for this method to process and classify the segments. Otherwise, both positive and negative vectors may be initialized with some default values. For segments that have SNR smaller than TH2 then a determination for −1 or 1 is computed, otherwise it is set to 0 (e.g., meaning a transition).

The segment vector can be split into two positive and negative vectors and then converted to binary words. Each bit that is marked as 1 on positive vector is marked as 0 on the negative vector and each bit that is marked −1 in negative vector is marked as 1 in negative word and 0 in positive word. Both binary words can have the same bit marked at zero (depicting a transition for SNR>TH2), but none of them preferably can have the same bit set to 1.

In this example of FIG. 6, the following word (or pattern) is determined as: 01111110 for the sampled segments over a defined signal period. The word can be further evaluated to produce a first binary word for a positive vector and a second binary word for a negative vector. The first binary word is 0111 1110b=126d, and the second binary word is 0000 0000b=0d. If PLC activity is detected, an XNOR function can be applied to the first and second binary words, which produces a third binary word 10 0000 01 (e.g., 10 01 for side transitions and 0000 for center transitions) representing a pattern of potential transitions for the sampled signal. This pattern in FIG. 6 would indicate the potential presence of an arc fault signal as the side transitions are non-zero value (e.g., greater than zero) and diminish to center transitions having zero value which reflect PLC communication. In various embodiments, successive signal periods can be evaluated to confirm the presence of an arc fault signal.

Figure 7:
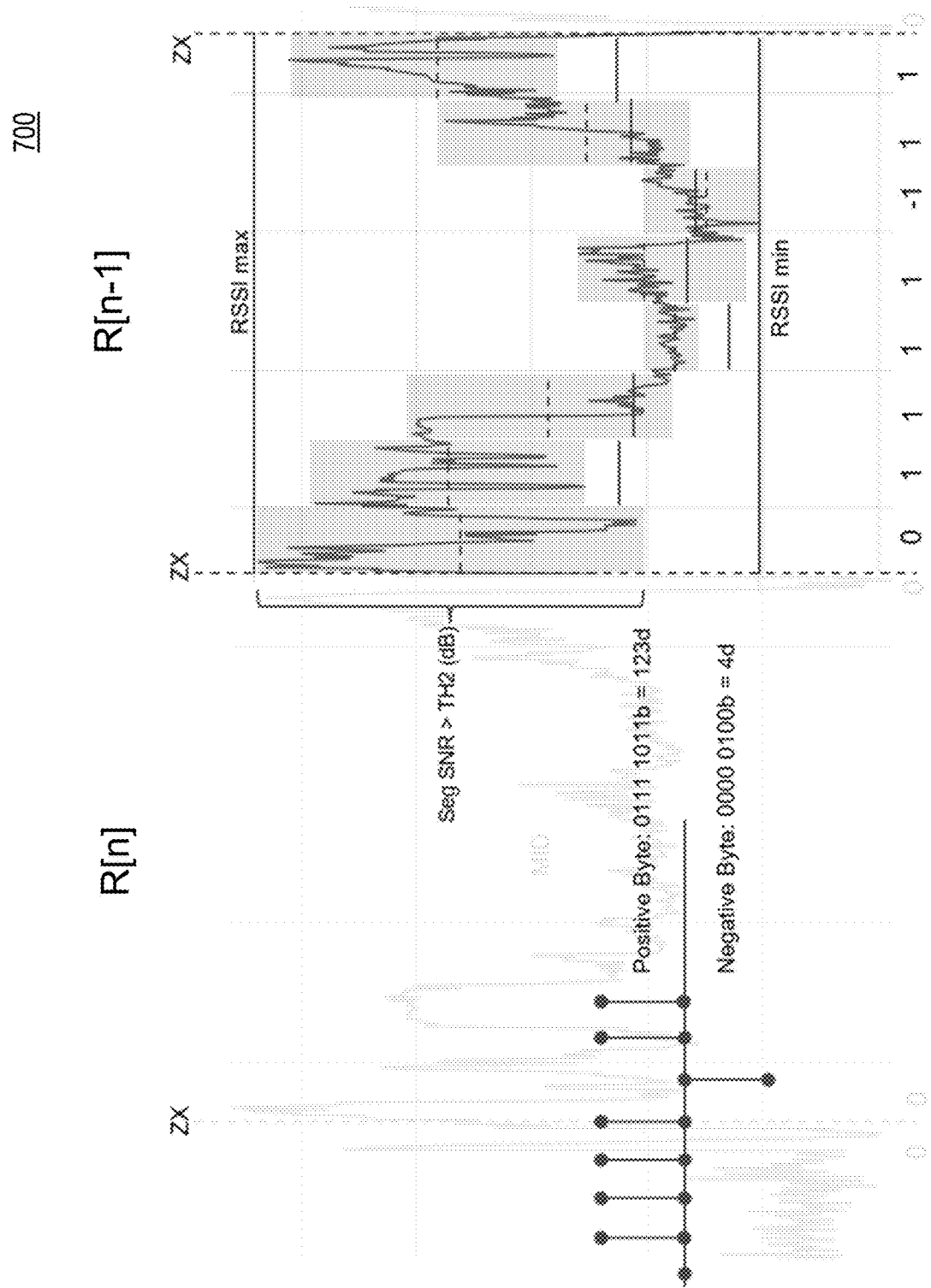
FIG. 7 illustrates a vector assignment example for sampled segments of a signal over a signal period, in accordance with an embodiment.

FIG. 7 illustrates a vector assignment example 700 for sampled segments of a signal over a signal period, in accordance with an embodiment. As with the example in FIG. 6, for each sampled segment [i], there can be determined (e.g., determined, computed, calculated, derived, assigned, etc.) SNR, RMS, Min and Max, where i=1 ... N and N is a number of segments for a defined signal period. A value (or representation thereof) can be determined (e.g., determined, computed, calculated, derived, assigned, etc.) for each segment [i] based on the SNR, RMS, Max and Min.

In this example, the following word (or pattern) is determined as: 0,1,1,1,1,−1,1,1 for the sampled segments over a defined signal period. The word can be further evaluated to produce a first binary word for positive vector and a second binary word for negative vector. The first binary word is 0111 1011b=123d, and the second binary word is 0000 0100b=4d. If PLC activity is detected, an XNOR function can be applied to the first and second binary words, which produces a third binary word 10 0000 00 (e.g., 10 00 for side transitions and 0000 for center transitions) representing a pattern of potential transitions for the sampled signal. This pattern in FIG. 7 would indicate the potential presence of an arc fault signal as the side transitions are non-zero value (e.g., greater than zero) and diminish to center transitions having zero value which reflect PLC communication. In various embodiments, successive signal periods can be evaluated to confirm the present of an arc fault signal.

Figure 8A:
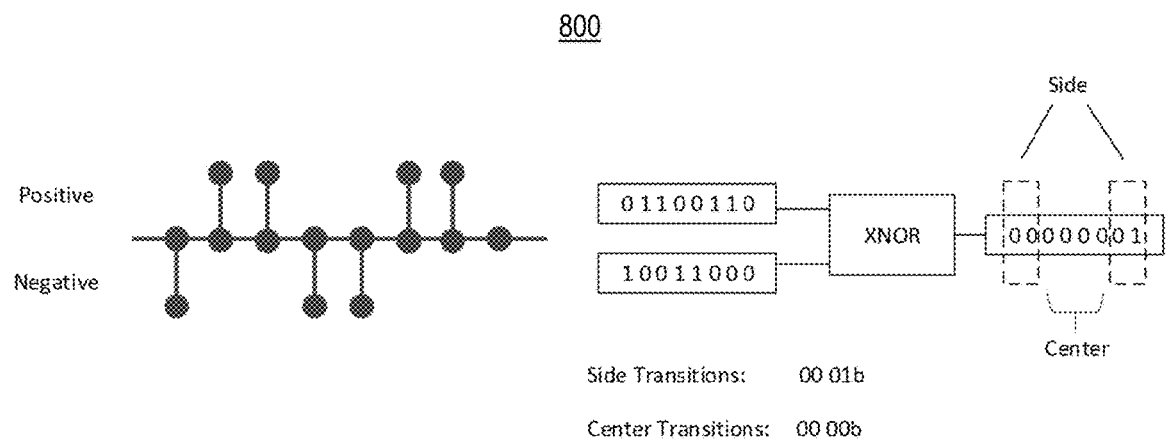
FIG. 8A illustrates a functional block diagram showing an example process by which positive and negative vectors for segment samples over a signal period are processed to detect arc fault signals on a power distribution system, in accordance with an embodiment.
Figure 8B:
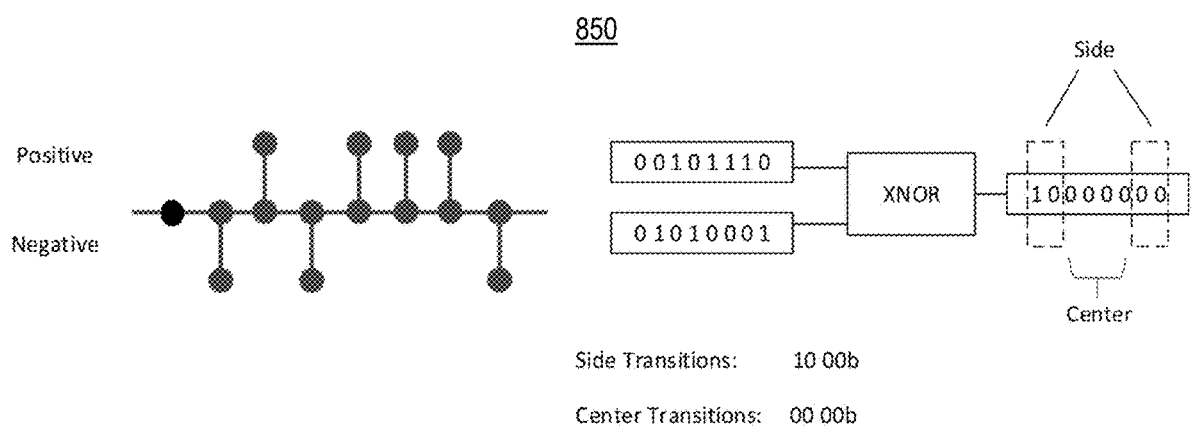
FIG. 8B illustrates a functional block diagram showing an example process by which positive and negative vectors for segment samples over a signal period are processed to detect arc fault signals on a power distribution system, in accordance with an embodiment.

FIGS. 8A and 8B illustrate example processes by which positive and negative vectors for segment samples over a signal period are processed to detect arc fault signals on a power distribution system, in accordance with various embodiments. For example, once the power line carrier flag is determined, the computation of two new transition parameters can be performed. When both positive word and negative word have corresponding 0 values, it means a transition occurred due to large SNR value. To extract where these transitions happened, first both binary words are XNORed (eXclusive Not OR) together which will indicate on which segment the transition occurred by marking that segment bit to 1.

Since these bits depict the location of the transitions, then it is important to group these bits into two regions, side region and center regions. Since AF signals have transitions over the zero crosses, both side regions can contain transitions. However, the center region is less likely to have many transitions due to AF signals, but it is likely that during power line carrier traffic the transitions will be present as well.

As shown in FIG. 8A, a functional block diagram 800 is provided to illustrate an example process by which positive and negative vectors for segment samples over a signal period are processed to detect arc fault signals on a power distribution system, in accordance with an embodiment.

In this example, for each segment of a sampled signal, a representative value has been determined such as follows −1,1,1,−1,−1,1,1,0 as shown on the left side of FIG. 8A. These values may be determined using the process or operations described, for example, in relation to FIGS. 4, 6 and 7 described above. A positive vector and a negative vector can be determined (or updated) from these values, and can be reflected as a first binary word and a second binary word, respectively. In FIG. 8A, the first binary word is 01100110 (positive vector/binary word), and the second binary word is 10011000 (negative vector/binary word). An exclusive-NOR (or XNOR) function 802 can be applied to the first and second binary words to produce a third binary word from which signal transitions, if any, can be identified. In this example, the third binary word is 00 0000 01, and can be separated into sub-words/regions, such as the side regions and center region (e.g., 00/0000/01). For example, the word for the side transitions is 00 01b and the word for the center transitions is 00 00b.

If there is PLC interference, the third binary word would reflect, for example, a value of side transitions greater than zero and a value of center transitions equal to zero, thereby reflecting a presence of an arc fault signal.

As shown in FIG. 8B, a functional block diagram 850 is provided to illustrate an example process by which positive and negative vectors for segment samples over a signal period are processed to detect arc fault signals on a power distribution system, in accordance with an embodiment.

In this example, for each segment of a sampled signal, a representative value has been determined such as follows 0,−1,1,−1,1,1,1,−1 as shown on the left side. These values may be determined using the process or operations described, for example, in relation to FIGS. 4, 6 and 7 described above. A positive vector and a negative vector can be determined (or updated) from these values, and can be reflected as a first binary work and a second binary word, respectively. In FIG. 8B, the first binary word is 00101110 (positive vector/binary word), and the second binary word is 01010001 (negative vector/binary word). An exclusive-NOR (or XNOR) function 852 can be applied to the first and second binary words to produce a third binary word from which signal transitions, if any, can be identified. In this example, the third binary word is 10 0000 00, and can be separated into sub-words/regions, such as the side regions and center region (e.g., 10/0000/00). For example, the word for the side transitions is 10 00b and the word for the center transitions is 00 00b.

If there is PLC interference, the third binary word would reflect, for example, a value of side transitions greater than zero and a value of center transitions equal to zero, thereby reflecting a presence of an arc fault signal.

In various embodiments, depending on the number of segments configured for processing and the number of bits these positive and negative binary words have, the segment regions can contain more or a smaller number of bits. Also, these regions do not need to have the same number of bits.

A running minimum filter for center transitions can be performed between a certain number of half-cycles. During any PLC data traffic that can run over 1 or 2 half-cycles, the center transitions can be filtered out; otherwise as shown and described in the examples below, there may be a significant difference between PLC and AF values.

Figure 9A:
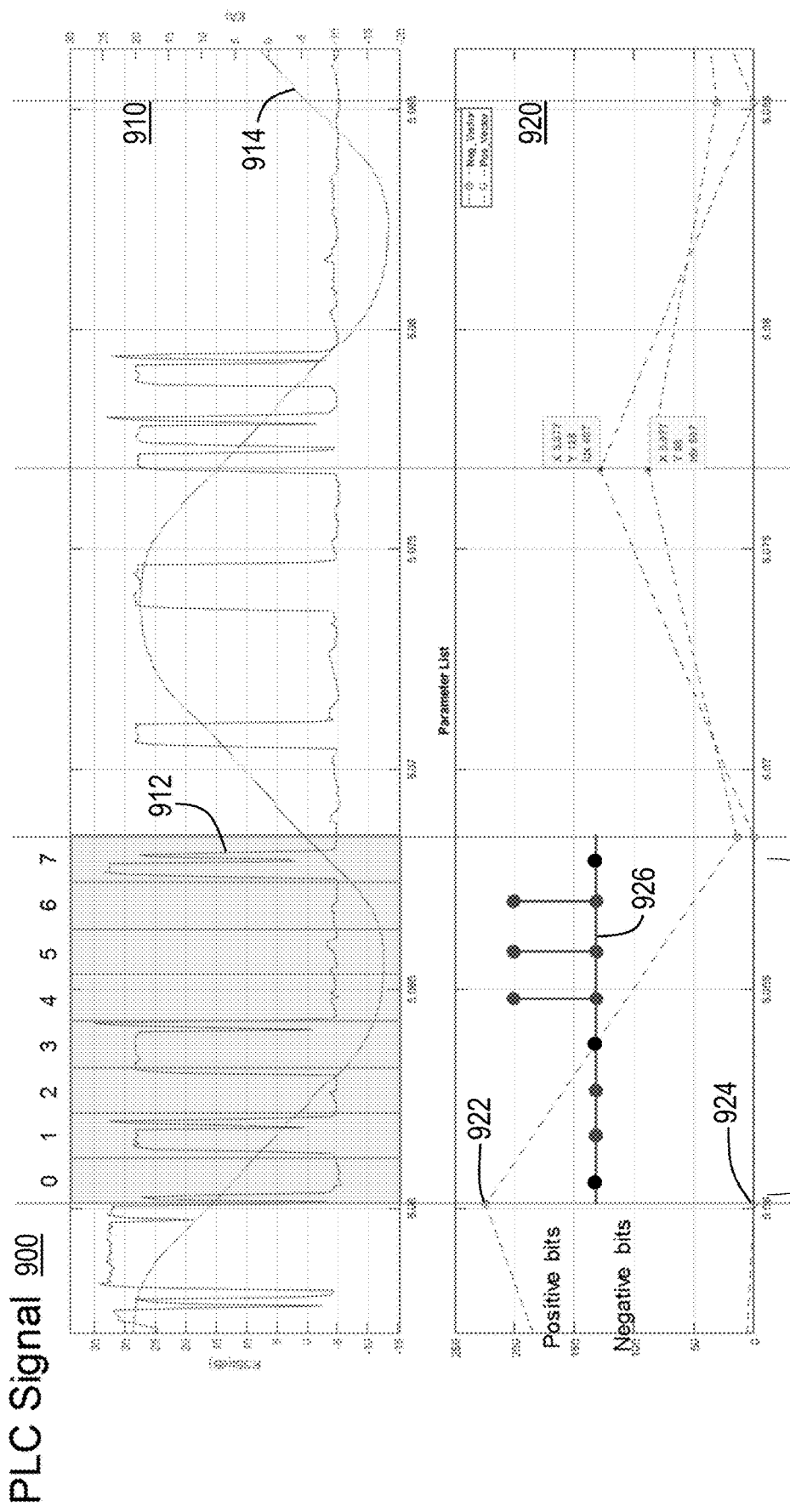
FIG. 9A illustrates a vector assignment example for sampled segments of a signal over a signal period, regarding a PLC signal, in accordance with an embodiment.
Figure 9B:
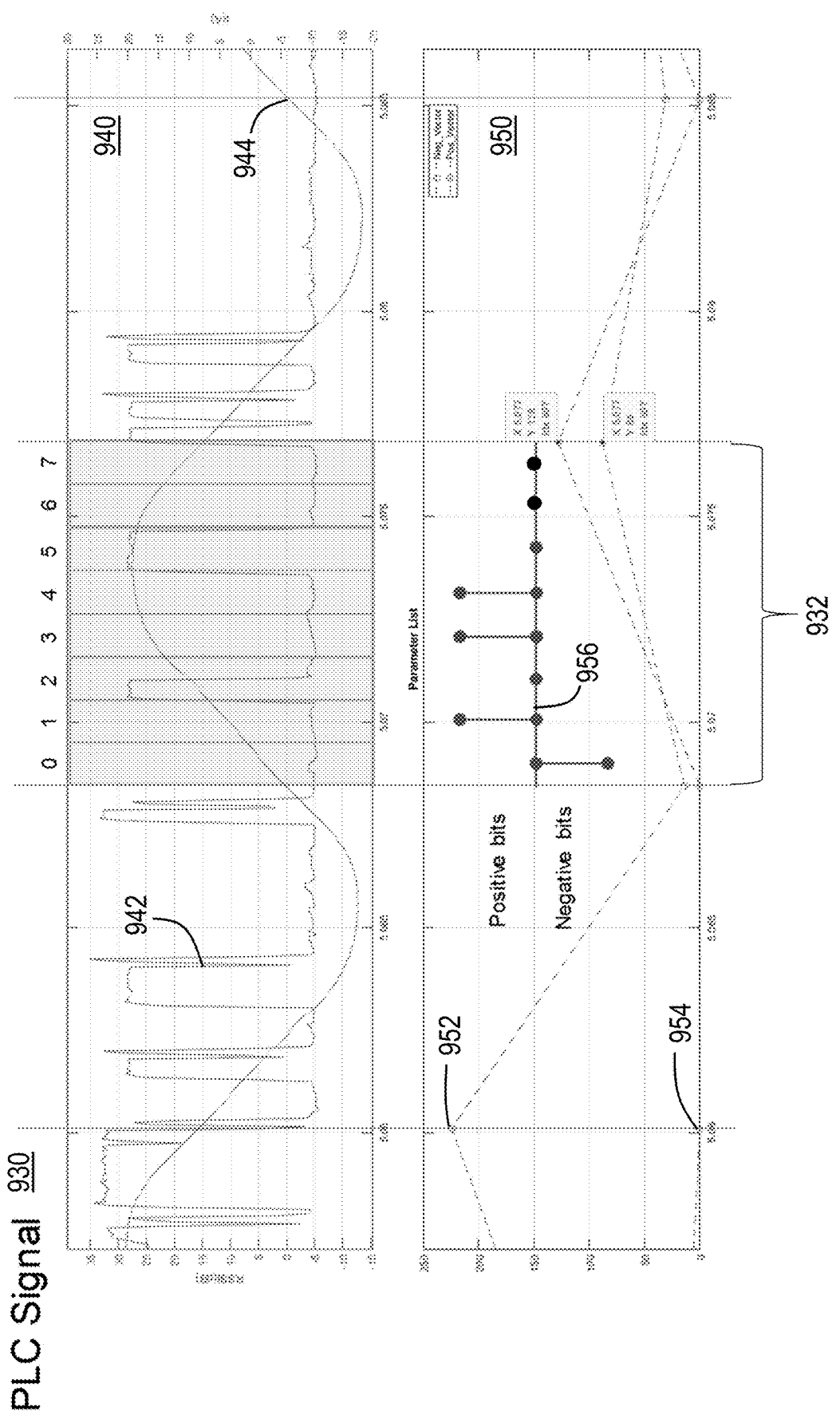
FIG. 9B illustrates a vector assignment example for sampled segments of a signal over a signal period, regarding a PLC signal, in accordance with an embodiment.

FIGS. 9A and 9B illustrate examples of Power Line Carrier (PLC) signals and their corresponding positive and negative vectors converted to bytes. Both Positive and Negative vectors are depicted in a parameter list converted to binary.

Power line carriers can contain synchronization signals that are transmitted, for example, every two AC line periods (50 Hz or 60 Hz) usually synchronized by the voltage zero-cross. This synchronization signal, which is called PLC Beacon, over time can be decoded into patterns, which can be stored for future use in identifying PLC activity on a circuit. For example, using the negative vector, these patterns can be processed to determine the presence of any power line carrier signals in the future when there will be any data or Internet activity, e.g., usually movie streaming or large data transferring activities. An example is shown in FIG. 9C of PLC Beacon and its corresponding positive and negative vectors converted to bytes.

In FIG. 9A, there is shown a vector assignment example 900 for sampled segments of a signal over a signal period, regarding a PLC signal, in accordance with an embodiment. In this example, there is a presence of a PLC signal(s). As shown in FIG. 9A, a graph 910 shows sampled signals (e.g., RSSI samples) 912 and an AC or current signal 914 over time, and a graph 920 shows vector representation of the positive vector(s) 922 and the negative vector(s) 924 corresponding to the sampled signals. Representative value can be determined for each of the segments of a sampled signal over a period 902 from analysis of the sampled segments, such as described herein, to reflect a signal pattern for the sampled signal over time. In this example, the sampled segments of the sampled signal over the period 902 have been evaluated and can be expressed as follows: 00001110 as shown by 926, from which positive and negative vectors can be ascertained for the sampled signal. The period 902 can be a half-cycle.

In FIG. 9B, there is shown a vector assignment example 930 for sampled segments of a signal over a signal period, regarding a PLC signal, in accordance with an embodiment. In this example, there is a presence of a PLC signal(s). As shown in FIG. 9A, a graph 940 shows sampled signals (e.g., RSSI samples) 942 and an AC or current signal 944 over time, and a graph 950 shows vector representation of the positive vector(s) 952 and the negative vector(s) 954 corresponding to the sampled signals. Representative value can be determined for each of the segments of a sampled signal over a period 932 from analysis of the sampled segments, such as described herein, to reflect a signal pattern for the sampled signal over time. In this example, the sampled segments of the sampled signal over the period 932 have been evaluated and can be expressed as follows: −1,1,0,1, 1,0,0,0 as shown by 956, from which positive and negative vectors can be ascertained for the sampled signal. The period 932 can be a half-cycle.

Figure 9C:
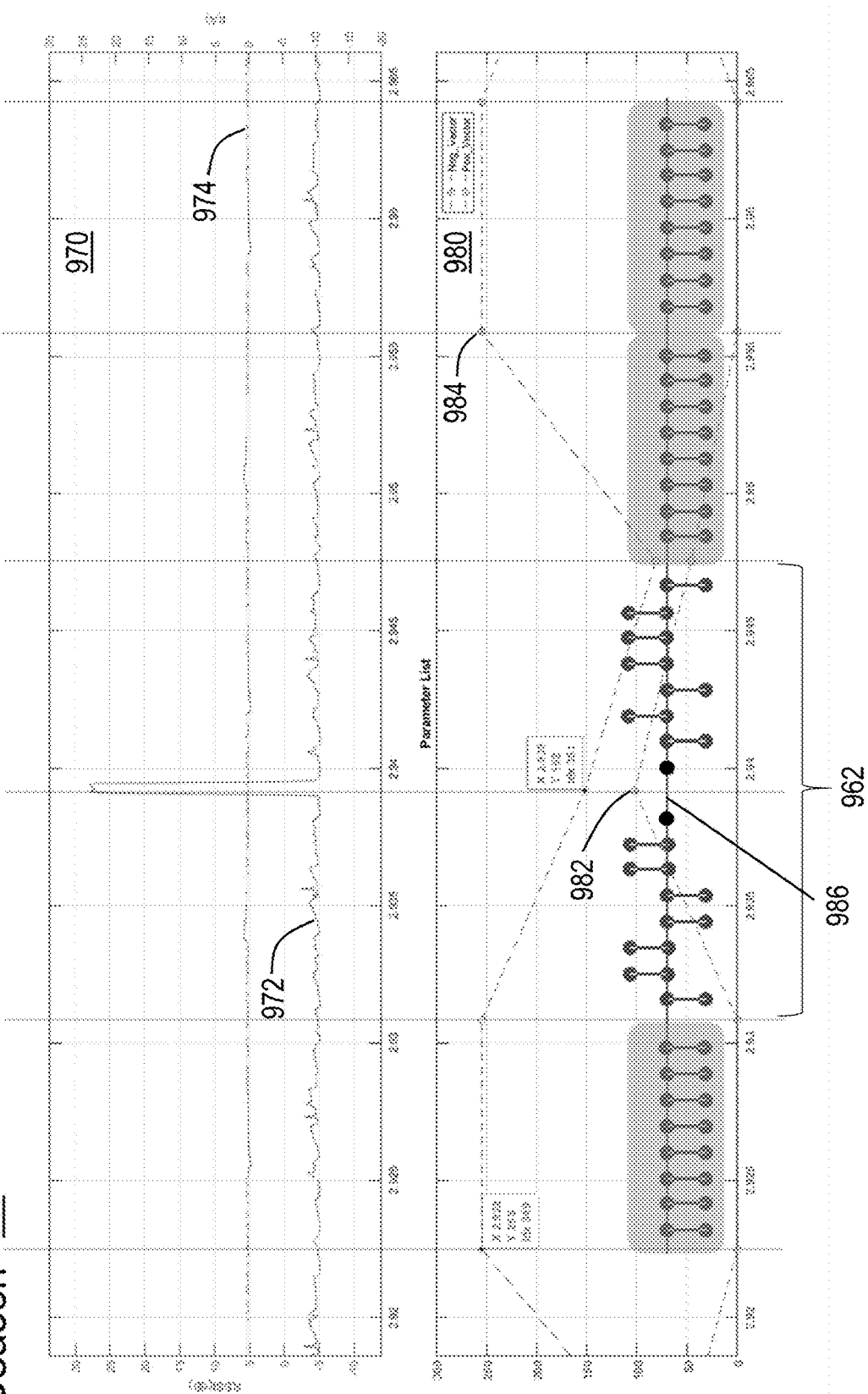
FIG. 9C illustrates a vector assignment example for sampled segments of a signal over a signal period, regarding a PLC beacon, in accordance with an embodiment.

In FIG. 9C, there is shown a vector assignment example 960 for sampled segments of a signal over a signal period, regarding a PLC Beacon, in accordance with an embodiment. In this example, there is a presence of a PLC signal(s). As shown in FIG. 9C, a graph 970 shows sampled signals (e.g., RSSI samples) 972 and an AC or current signal 974 over time, and a graph 980 shows vector representation of the positive vector(s) 982 and the negative vector(s) 984 corresponding to the sampled signals. Representative value can be determined for each of the segments of a sampled signal over a period 902 from analysis of the sampled segments, such as described herein, to reflect a signal pattern for the sampled signal over time. In this example, the sampled segments of the sampled signal over a first the period 962 have been evaluated and can be expressed as follows: −1,1,1,−1,−1,1,1,0) followed by 0,−1,1,−1,1,1,1,−1 over the period 962 as shown by 986, from which positive and negative vectors can be ascertained for the sampled signal (or portions thereof).

Figure 10:
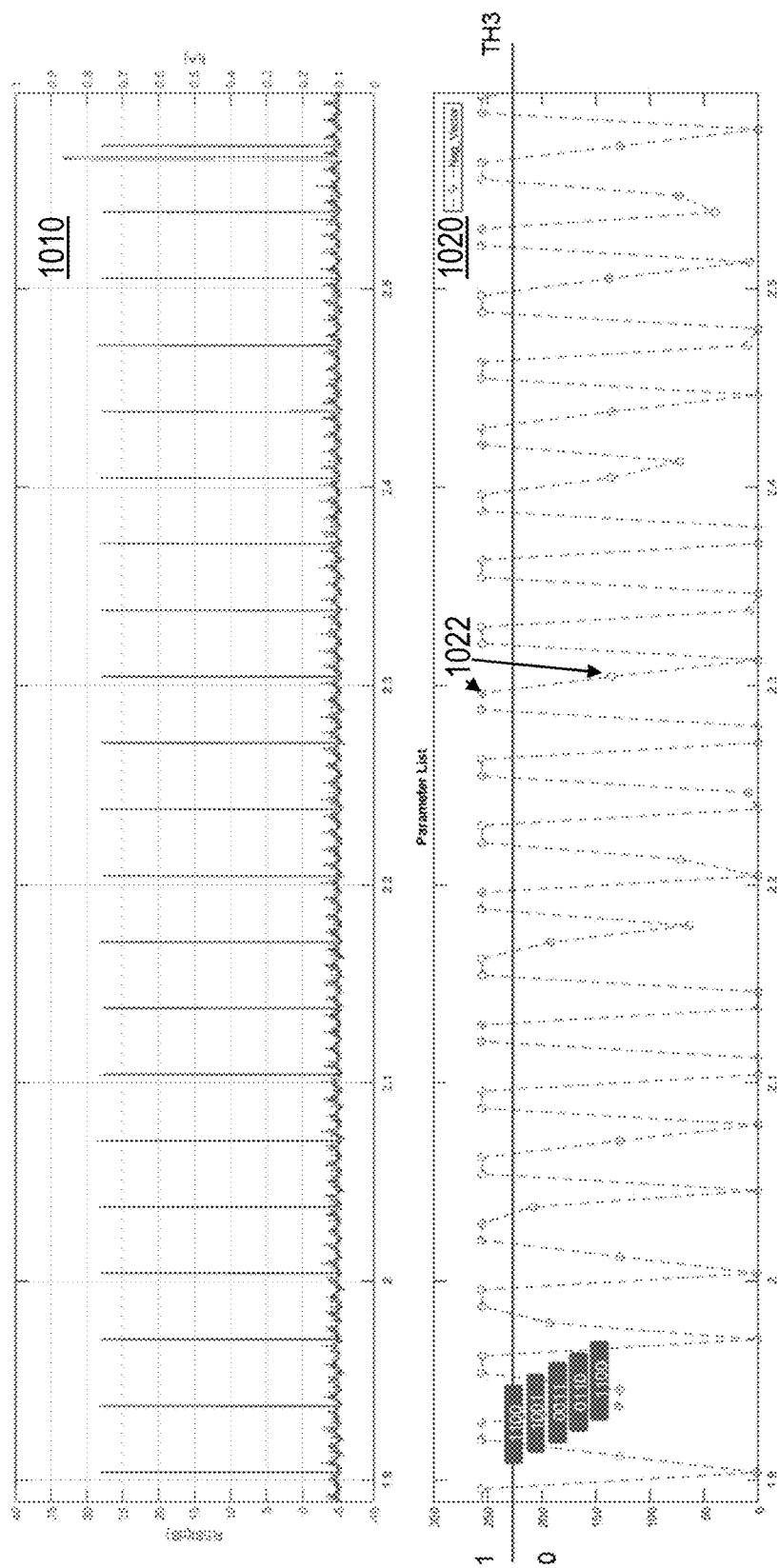
FIG. 10 illustrates example PLC beacons converted 4-HC (Half-Cycles) in an AC network to 4 bit patterns in an example Group A, in accordance with an embodiment.
Figure 11:
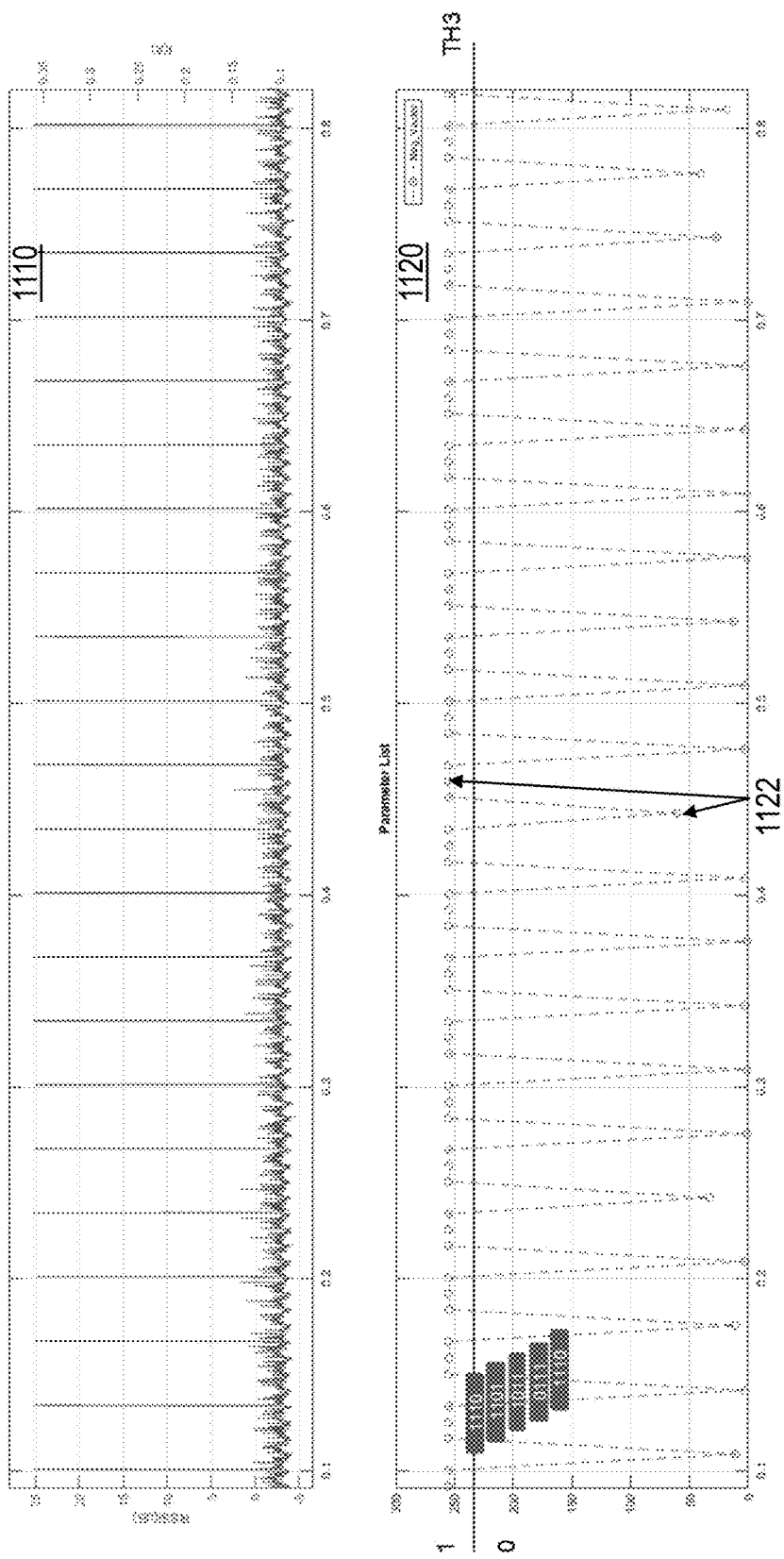
FIG. 11 illustrates example PLC beacons converted 4-HC (Half-Cycles) in an AC network to 4 bit patterns in Group B, in accordance with an embodiment.

Examples are shown in FIGS. 10 and 11 where a PLC Beacon signal is processed into two unique pattern groups (e.g., Group A and Group B) which can be used to detect with sufficiently high confidence the presence of any power line carriers. This method can employ at least 4 half-cycles.

By applying a new threshold (e.g., TH3) for each negative word, a new binary value can be created which creates a unique set of patterns over 4 half-cycles (HF). Depending on the location of the beacon signal (since this synchronization signal can drift over time with respect to the line voltage), pattern can be categorized into two Groups A or B. The same network with power line carrier modules present can start with patterns from Group A and then shift to Group B and rotate between them. Therefore, it is desirable to detect for both patterns, which can allow a flexible and adaptive algorithm to adjust at any synchronization drifts that the PLC modules may have.

In various embodiments, using a counter to measure the number of patterns occurring can increase the accuracy for power line carrier presence flag.

FIG. 10 illustrates example 1000 of PLC beacons converted from 4-HC (Half-Cycles) in an AC network to 4-bit patterns in an example Group A, in accordance with an embodiment. As shown in FIG. 10, graph 1010 shows examples of monitored signal samples over time (e.g., RSSI samples), and graph 1020 shows corresponding vector representation of negative vectors 1022, which reflect a signal pattern of a PLC beacon. The signal pattern of the PLC beacon can be expressed as a binary word with bit values (e.g., 0 or 1) in relation to a sample segment threshold (e.g., TH3). In this example, a PLC beacon is shown with an initial pattern 1100, where a bit 1 is assigned if a value of a negative vector for a segment is greater than the segment threshold, and a bit 0 is assigned if a value of a negative vector for a segment is less than (or equal to) the segment threshold. By way of example, the pattern 1100 can be part of a PLC pattern referred to herein as Group A, which can drift from 1100 to 1001 to 0011 to 0110 and back to 1100 (or between these patterns), and may be employed to conduct PLC communication over a protected circuit.

In various embodiments, the processor can be configured to monitor sample signals on the protected circuit, to detect PLC communication, and to decode PLC patterns associated with PLC communication, including patterns for PLC beacons employed (or to be employed) on the circuit. Such PLC patterns can be stored in a memory for use in detecting a presence or absence of PLC activity on the circuit.

FIG. 11 illustrates example 1100 of PLC beacons converted from 4-HC (Half-Cycles) in an AC network to 4-bit patterns in a Group B, in accordance with an embodiment. As shown in FIG. 11, graph 1110 shows examples of monitored signal samples over time (e.g., RSSI samples), and graph 1120 shows corresponding vector representation of negative vectors 1122, which reflect a signal pattern of a PLC beacon. The signal pattern of the PLC beacon can be expressed as a binary word with bit values (e.g., 0 or 1) in relation to a sample segment threshold (e.g., TH3). In this example, a PLC beacon is shown with an initial pattern 1110, where a bit 1 is assigned if a value of a negative vector for a segment is greater than the segment threshold, and a bit 0 is assigned if a value of a negative vector for a segment is less than (or equal to) the segment threshold. By way of example, the pattern 1110 can be part of a PLC pattern referred to herein as Group B, which can drift from 1110 to 1101 to 1011 0111 and back to 1110 (or between these patterns), and may be employed to conduct PLC communication over a protected circuit.

In various embodiments, the processor can be configured to monitor sample signals on the protected circuit, to detect PLC communication, and to decode PLC patterns associated with PLC communication, including patterns for PLC beacons employed (or to be employed) on the circuit. Such PLC patterns can be stored in a memory for use in detecting a presence or absence of PLC activity on the circuit.

Figure 12:
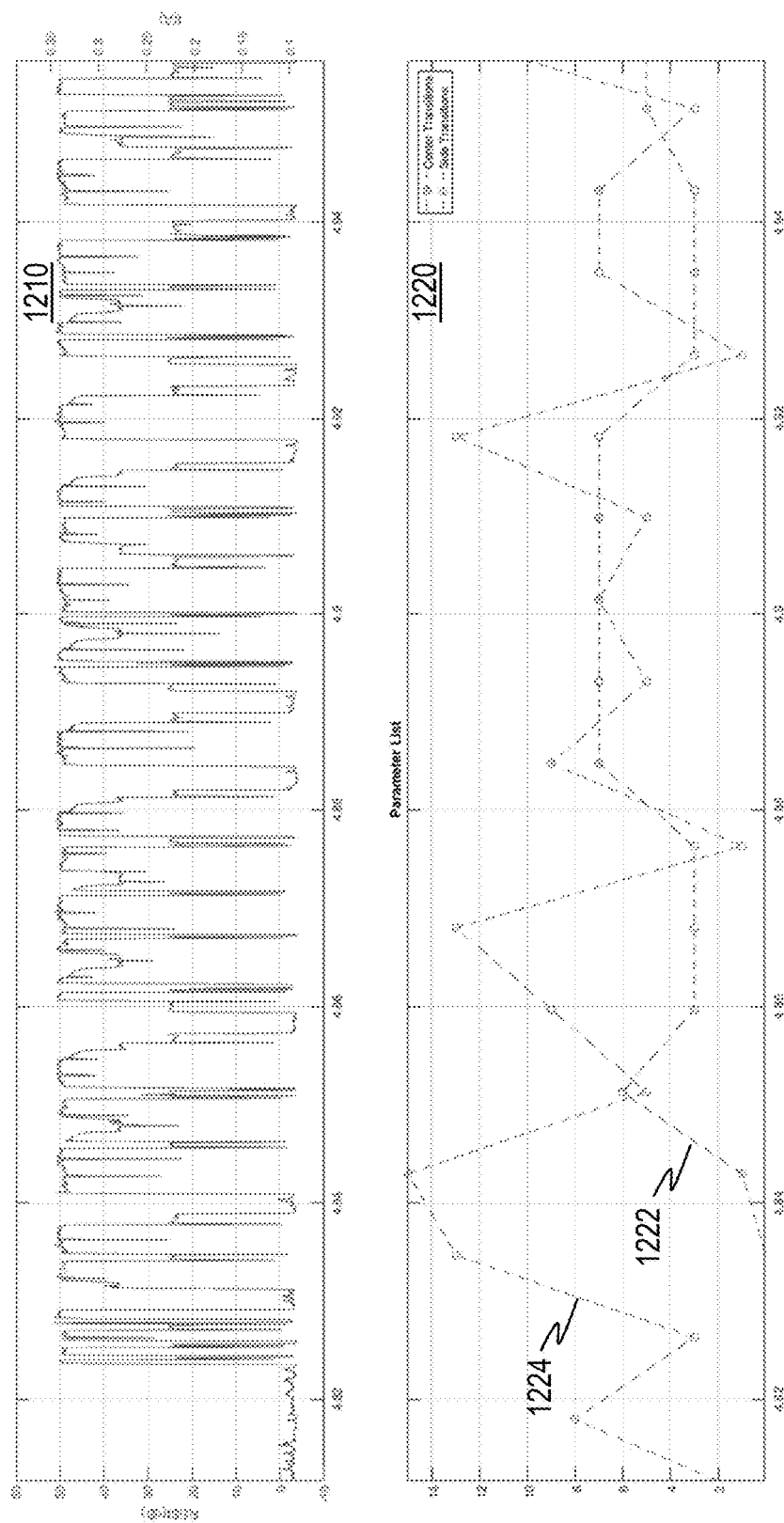
FIG. 12 illustrates example graphs showing side and center transitions in relation to PLC, in accordance with an embodiment.

FIG. 12 illustrates example 1200 of graphs showing side and center transitions in relation to PLC, in accordance with an embodiment. As shown in FIG. 12, a graph 1210 shows examples of monitored signal samples overtime (e.g., RSSI samples), and a graph 1220 (parameter list) shows corresponding vector representation, which reflects a pattern, for center transitions 1222 and side transitions 1224. As described herein, when PLC communication is present, the center transitions and side transitions can be analyzed to determine the presence (or not) of an arc fault signal.

In this example, there is a clear number of center and side transitions generated from the power line carrier RSSI signal. None of these half-cycles can be classified as arc fault half-cycles; therefore, the AF detection algorithm can ignore and does not determine a trip condition.

Figure 13:
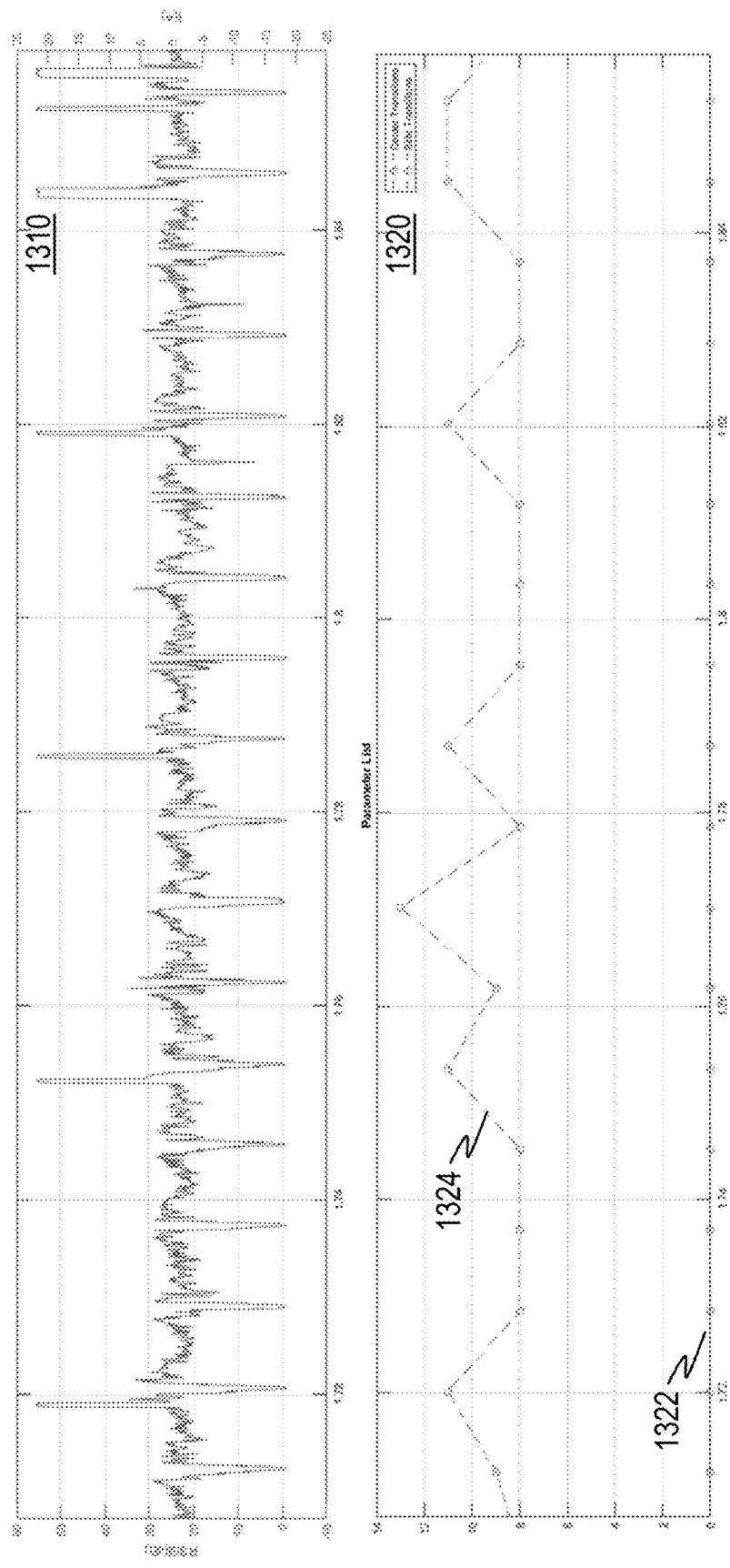
FIG. 13 illustrates example graphs showing side and center transitions in relation to PLC and arc fault signals, in accordance with an embodiment.

FIG. 13 illustrates example 1300 of graphs showing side and center transitions in relation to PLC and arc fault signals, in accordance with an embodiment. As shown in FIG. 13, a graph 1310 shows examples of monitored signal samples over time (e.g., RSSI samples), and a graph 1320 (parameter list) shows corresponding vector representation, which reflects a pattern, for center transitions 1322 and side transitions 1324. As described herein, when PLC communication is present, the center transitions and side transitions can be analyzed to determine the presence (or not) of an arc fault signal. In this example, there is an arc fault signal(s).

In this example, the arc fault signal does not have any center transitions even though there is a PLC signal present. Therefore, the AF detection algorithm can classify these half-cycles as arcing and determine a trip condition.

Various example methods and systems (including components thereof) are described herein. It should be understood that the various example of the method and system may employs various signal processing circuits, including but not limited to converter(s) (e.g., A/D converter(s)), signal conditioning circuitry, filter(s), and so forth, to facilitate the implementation of the various operations and functions described herein. Furthermore, the arc fault detection method and system may be implemented on a circuit protective device such as a circuit breaker or interrupter, or implemented separately therefrom in a computer-implemented detection system which can be used to control one or more circuit protective devices in response to detection of arc fault or other fault conditions.

It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, characteristics, thresholds, and other elements used herein are provided as examples, and can be given a different name or label. The use of the term "or" is not limited to exclusive "or", but can also mean "and/or".

It will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware or any combination thereof.

Any resulting program(s), having computer-readable program code, may be embodied on one or more tangible or non-transitory computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable or storage medium or in any transmitting medium which transmits such a program.

A processor(s), controller(s) or processing unit(s) as described herein can be a processing system, which can include one or more processors, such as CPU, controller, ASIC, or other processing unit or circuitry, which controls or performs the operations of the devices or systems, described herein. Memory/storage devices can include, but are not limited to, disks, solid state drives, optical disks, removable memory devices such as smart cards, SIms, WIMs, semiconductor memories such as RAM, ROM, PROMS, etc. Transmitting mediums or networks include, but are not limited to, transmission via wireline communication, wireless communication (e.g., Radio Frequency (RF) communication, Bluetooth®, Wi-Fi, Li-Fi, etc.), the Internet, intranets, telephone/modem-based network communication, hard-wired/cabled communication network, satellite communication, and other stationary or mobile network systems/communication links. Wireline communication can include power line communication.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

The invention claimed is:

1. A method comprising:
sampling, by a controller, a signal measuring electrical activity on a circuit of a power distribution system, the sampled signal corresponding to a signal strength of the electrical activity on the circuit, the sampled signal comprising a plurality of sample segments;
for each sample segment, computing segment properties including a signal-to-noise ratio (SNR) and a root-mean-square (RMS);
generating, by the controller, a pattern representing a presence of any signal transition over a signal sample period for the sampled signal according to the computed segment properties for each sample segment of the sampled signal; and
determining, by the controller, a presence of an arc fault signal based on the generated pattern and one or more predetermined patterns of power line carrier (PLC) activity on the circuit.

2. The method of claim 1, further comprising:
determining, by the controller, a presence of PLC activity across the circuit;
wherein the segment properties are computed in response to at least the presence of PLC activity on the circuit.

3. The method of claim 1, wherein the generated pattern is a binary word having side regions reflecting potential side transitions and a center region reflecting potential center transitions, the presence of an arc fault signal is determined when the side transitions of the generated pattern have a non-zero value and diminish to a zero value in the center transitions of the generated pattern, the side transitions with the non-zero value representing captured transitions around zero-cross around arc strike and quench regions, the center transitions with the zero value representing PLC communication.

4. The method of claim 1, wherein the generating operation comprises:
assigning one of a positive, negative or zero value based on the computed SNR and/or RMS for each of the sample segments in comparison to a respective segment property threshold;

creating a first binary word to reflect any positive vector representations across the plurality of sample segments;

creating a second binary word to reflect any negative vector representation across the plurality of sample segments; and applying a XNOR (Exclusive Not Or) function to the first and second binary words to create a third binary word for the sampled signal.

5. The method of claim 4, wherein the determining comprises:

analyzing a value of side transitions/regions and center transitions/region from the third binary word to detect a presence of an arc fault signal.

6. The method of claim 4, wherein the segment property threshold can comprise a dynamic threshold.

7. The method of claim 1, further comprising:

determining one or more patterns of PLC activity on the circuit, the one or more patterns of PLC activity including at least a pattern of PLC beacon; and storing the one or more patterns of PLC activity as the one or more predetermined patterns of PLC activity.

8. The method of claim 1, further comprising:

in response to a detection of an absence of PLC activity, performing fault detection by comparing a signal strength of high frequency signals within an electrical activity, including voltage or current, to a set of dynamic thresholds.

9. The method of claim 1, wherein the PLC activity can comprise a PLC beacon or PLC communication.

10. The method of claim 1, wherein the sampled signal comprises an RSSI (Receiver Signal Strength Indicator) signal, which is generated by a logarithmic amplifier device based on electrical signals monitored on the circuit by at least one sensor, each of the sample segments of the sampled signal having the same length which comprises a half-cycle signal.

11. A system comprising:

a memory; and a processor configured to:

sample a signal measuring electrical activity on a circuit of a power distribution system, the sampled signal corresponding to a signal strength of the electrical activity on the circuit, the sampled signal comprising a plurality of sample segments;

for each sample segment, compute segment properties including a signal-to-noise ratio (SNR) and a root-mean-square (RMS);

generate a pattern representing a presence of any signal transition over a signal sample period for the sampled signal according to the computed segment properties for each sample segment of the sampled signal; and determine a presence of an arc fault signal based on the generated pattern and one or more predetermined patterns of power line carrier (PLC) activity on the circuit.

12. The system of claim 11, wherein the processor is further configured to:

determine a presence of PLC activity across the circuit;

wherein the segment properties are computed in response to at least the presence of PLC activity on the circuit.

13. The system of claim 11, wherein the generated pattern is a binary word having side regions reflecting potential side transitions and a center region reflecting potential center transitions, the presence of an arc fault signal is determined when the side transitions of the generated pattern have a non-zero value and diminish to a zero value in the center transitions of the generated pattern, the side transitions with the non-zero value representing captured transitions around zero-cross around arc strike and quench regions, the center transitions with the zero value representing PLC communication.

14. The system of claim 11, wherein, to generate the pattern, the processor is configured to:

assign one of a positive, negative or zero value based on the computed SNR and/or RMS for each of the sample segments in comparison to a respective segment property threshold;

create a first binary word to reflect any positive vector representations across the plurality of sample segments;

create a second binary word to reflect any negative vector representation across the plurality of sample segments; and apply a XNOR (Exclusive Not Or) function to the first and second binary words to create a third binary word for the sampled signal.

15. The system of claim 14, wherein, to determine the presence of an arc fault signal, the processor is configured to:

analyze a value of side transitions/regions and center transitions/region from the third binary word to detect a presence of an arc fault signal.

16. The system of claim 14, wherein the segment property threshold can comprise a dynamic threshold.

17. The system of claim 11, wherein the processor is further configured to:

determine one or more patterns of PLC activity on the circuit, the one or more patterns of PLC activity including at least a pattern of PLC beacon; and store in memory the one or more patterns of PLC activity as the one or more predetermined patterns of PLC activity.

18. The system of claim 11, wherein the processor is further configured to:

in response to a detection of an absence of PLC activity, perform fault detection by comparing a signal strength of high frequency signals within an electrical activity, including voltage or current, to a set of dynamic thresholds.

19. The system of claim 11, wherein the PLC activity can comprise a PLC beacon or PLC communication.

20. The system of claim 11, wherein the sampled signal comprises an RSSI (Receiver Signal Strength Indicator) signal, which is generated by a logarithmic amplifier device based on electrical signals monitored on the circuit by at least one sensor, each of the sample segments of the sampled signal having the same length which comprises a half-cycle signal.

21. A non-transitory computer medium storing computer executable code, which when executed by one or more processors, is configured to implement a method comprising:

sampling, by a controller, a signal measuring electrical activity on a circuit of a power distribution system, the sampled signal corresponding to a signal strength of the electrical activity on the circuit, the sampled signal comprising a plurality of sample segments;

for each sample segment, computing segment properties including a signal-to-noise ratio (SNR) and a root-mean-square (RMS);

generating, by the controller, a pattern representing a presence of any signal transition over a signal sample period for the sampled signal according to the computed segment properties for each sample segment of the sampled signal; and determining, by the controller, a presence of an arc fault signal based on the generated pattern and one or more predetermined patterns of power line carrier (PLC) activity on the circuit.

\* \* \* \* \*